(12) United States Patent
Andersson et al.

(10) Patent No.: US 7,471,534 B2
(45) Date of Patent: Dec. 30, 2008

(54) INVERTER TYPE MOTOR DRIVE UNIT

(75) Inventors: Tord Rickard Andersson, Tyreso (SE);
Carl Mikael Forborgen, Tyreso (SE);
Oliver Gallas, Johanneshov (SE); **Ulf
Ingemar Karlsson**, Tyreso (SE);
Carl-Erik Malmstrom, Tyreso (SE)

(73) Assignee: Danaher Motion Stockholm AB,
Stockholm (SE)

( * ) Notice: Subject to any disclaimer, the term of this patent is extended or adjusted under 35 U.S.C. 154(b) by 444 days.

(21) Appl. No.: 10/540,820

(22) PCT Filed: Dec. 22, 2003

(86) PCT No.: PCT/SE03/02073

§ 371 (c)(1),
(2), (4) Date: Mar. 22, 2006

(87) PCT Pub. No.: WO2004/057746

PCT Pub. Date: Jul. 8, 2004

(65) Prior Publication Data

US 2006/0239050 A1    Oct. 26, 2006

(30) Foreign Application Priority Data

Dec. 23, 2002 (SE) .................................... 0203835

(51) Int. Cl.
*H05K 7/20* (2006.01)
*H01L 23/12* (2006.01)

(52) U.S. Cl. ................. 363/141; 363/131; 361/704; 361/707; 361/709; 361/710; 361/716; 361/718

(58) Field of Classification Search ............... 361/704, 361/707, 709–710, 715–719; 363/141, 131; 257/700

See application file for complete search history.

(56) References Cited

U.S. PATENT DOCUMENTS

| 5,459,655 | A | 10/1995 | Mori et al. |
| 5,715,141 | A | 2/1998 | Karlsson |
| 5,731,970 | A | 3/1998 | Mori et al. |
| 5,801,936 | A | 9/1998 | Mori et al. |
| 5,929,519 | A | 7/1999 | Mori et al. |

(Continued)

FOREIGN PATENT DOCUMENTS

EP    0 533 158 A2    3/1993

(Continued)

*Primary Examiner*—Jayprakash N Gandhi
*Assistant Examiner*—Zachary M Pape
(74) *Attorney, Agent, or Firm*—Frishauf, Holtz, Goodman & Chick, P.C.

(57) ABSTRACT

An inverter type drive unit for feeding AC electric power of variable parameters to an electric motor has an electronic control section, and a power converting and output section which includes one or more identical power modules, each forming a complete 3-phase output stage. The power modules are arranged side-by-side in a multiplying direction and are clamped by retaining devices to a cooling structure. The power modules are connected in parallel to DC input terminals and to AC output terminals via conductive sheets which are insulated from each other. The DC connected conductive sheets cover substantially the entire physical surface area covered by the power modules so as to accomplish an even, simultaneous and low impedance DC current supply to all power modules.

30 Claims, 3 Drawing Sheets

U.S. PATENT DOCUMENTS

| | | | |
|---|---|---|---|
| 6,327,165 B1 * | 12/2001 | Yamane et al. | 363/132 |
| 6,359,331 B1 * | 3/2002 | Rinehart et al. | 257/691 |
| 7,012,810 B2 * | 3/2006 | Parkhill et al. | 361/775 |
| 7,187,568 B2 * | 3/2007 | Radosevich et al. | 363/144 |

FOREIGN PATENT DOCUMENTS

| | | |
|---|---|---|
| EP | 0693820 A1 | 1/1996 |

* cited by examiner

US 7,471,534 B2

INVERTER TYPE MOTOR DRIVE UNIT

This application is a U.S. National Phase Application under 35 U.S.C. 371 of International Application PCT/SE2003/002073 filed Dec. 22, 2003.

The invention relates to an electric motor drive unit of the inverter type for feeding AC electric power of variable current and frequency to an electric motor in relation to the actual operation condition of the motor, wherein the drive unit comprises an electronic control section and a power converting and output section connected via DC terminals at one end to a DC source and via AC terminals at its other end to the motor.

In order to easily adapt the drive unit to different power output demands, i.e. motors of different size, the power converting and output section comprises one or more identical power modules connected in parallel, such that a suitable number of power modules is chosen for a certain motor size.

A problem concerned with a modular type of power converting and output section is to obtain a necessarily high accuracy as to an even and simultaneous DC current supply to all modules, no matter their physical positions in relation to the DC input terminals as well as to each other.

The main object of the invention is to provide an improved inverter type motor drive unit of the above mentioned type wherein the DC current supply to the power module or modules is carried out symmetrically and at a very low impedance.

Another object of the invention is to provide an inverter type drive unit of the above recited type having a simple and easily assembled design.

A further object of the invention is to provide an inverter type drive unit of the above mentioned type wherein occurring heat resulted from current losses are effectively transferred to a cooling structure.

Further characteristic features and advantages of the invention will appear from the following specification wherein a preferred embodiment of the invention is described in detail with reference to the accompanying drawings.

IN THE DRAWINGS

Figure 1:
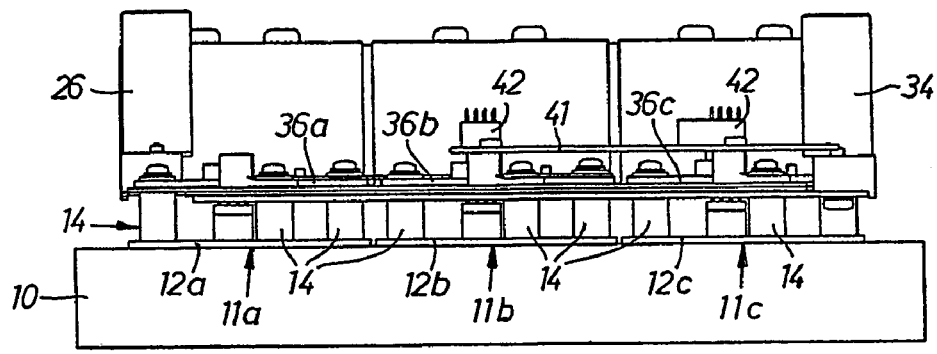
FIG. 1 shows an end view of the motor drive unit according to the invention.

The inverter type motor drive unit illustrated in the drawing figures, which is suitable for use in for instance battery powered trucks, comprises a mounting and cooling structure 10 of aluminium alloy on which is carried three identical power modules 11a-c. These power modules 11a-c form a power converting and output section. The three power modules 11a-c are located side by side on the cooling structure 10 and are intended to deliver AC power to a motor of a certain size. Each power module 11a-c forms a complete 3-phase output stage.

Figure 2:
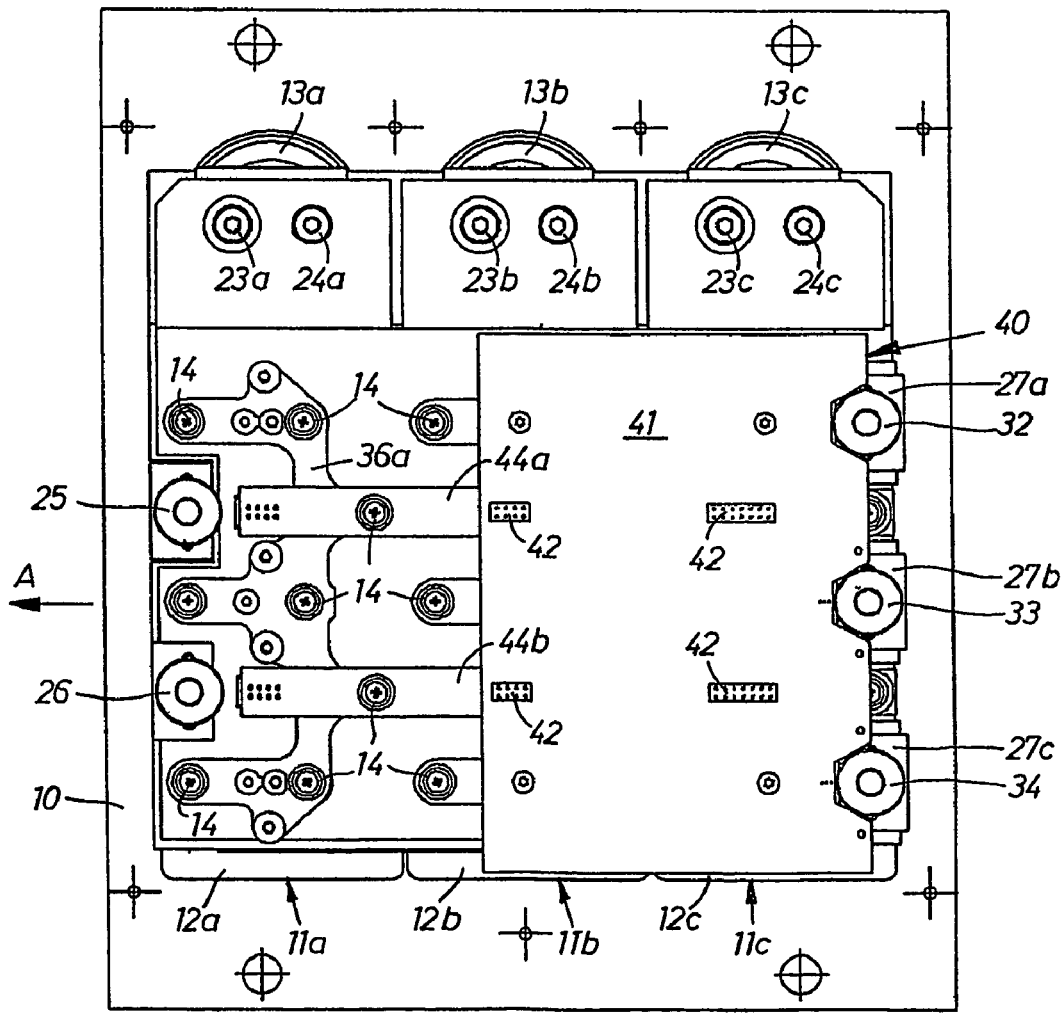
FIG. 2 shows a top view of a motor drive unit in FIG. 1.
Figure 3:
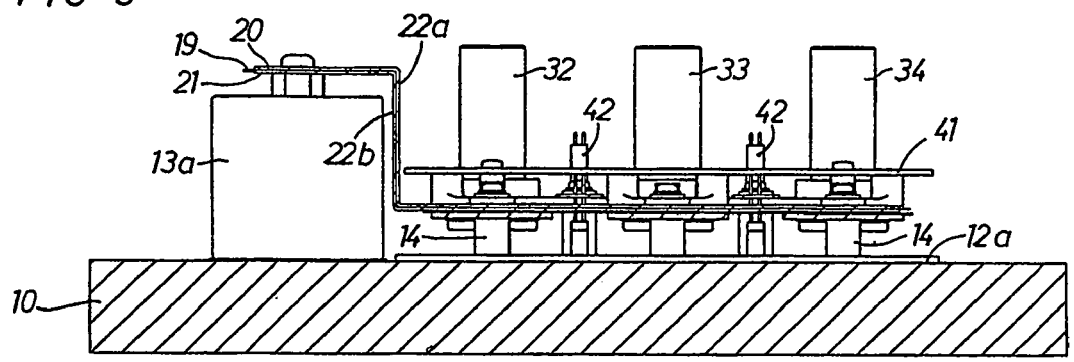
FIG. 3 shows a side view of the motor drive unit in FIG. 1.

The drive unit is easily adaptable to smaller or bigger motors with smaller or bigger power demands by altering the number of power modules. In case of a bigger motor the number of modules are increased in such a way that one or more identical modules are added in a parallel side-by-side fashion in a multiplying direction A on the cooling structure 10. See arrow in FIGS. 1 and 2. In case of a smaller motor one or two power modules are left out. Accordingly, the power modules 11a-c are multiplied by a suitable number and are arranged in parallel to meet the power demand of an actual motor size. The specific side-by-side location of the power modules 11a-c is important for obtaining an advantageous current distribution to all power modules 11a-c as described below.

Motor types suitable to be driven by this drive unit are asynchronous motors, permanent magnet motors and reluctance motors.

Each power module 11a-c comprises a conductive substrate 12a-c which carries a number of power switches (not illustrated) for converting an input DC current to a three-phase AC output current. For each power module 11a-c there is a capacitor bank 13a-c which is firmly mounted on the cooling structure 10 for heat transfer. The substrates 12a-c are also clamped into a heat transferring contact with the cooling structure 10 by means of retaining devices 14. Each retaining 14 device consists of a tubular distance piece 15 and a clamping screw 16, wherein the clamping screw 16 extends through the tubular distance piece 15 and is threaded into the cooling structure 10. See FIG. 4. The distance piece 15 is made of a metallic material for conducting electric current as well as heat between the conductive sheets 20,21,27a-c and the power modules 11a-c.

A substrate arrangement of this type is previously described in U.S. Pat. No. 5,715,141.

For connecting the power modules 11a-c to the DC input there are provided two electrically conductive layers in the form of metal sheets 20, 21. These sheets 20,21 have a size covering a surface area occupied physically by all three power modules 11a-c as, including the capacitor banks 13a-c which are covered via Z-shaped portions 22a,b of the sheets 20,21.

Figure 6:
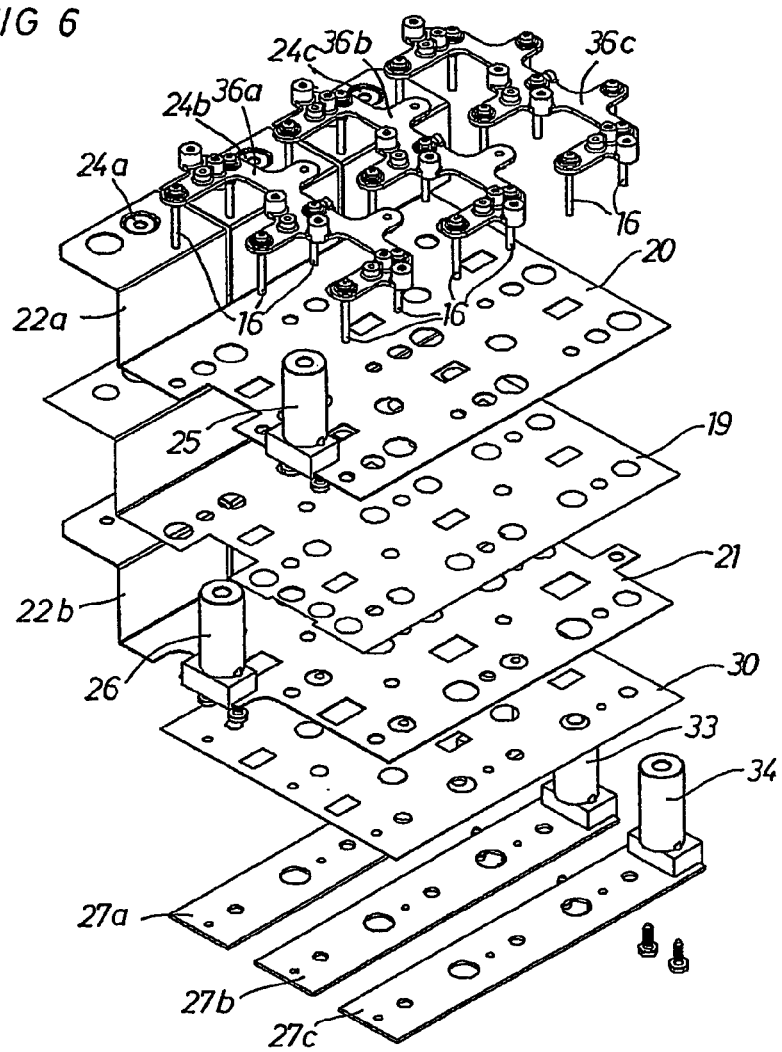
FIG. 6 shows an exploded view of the connection sheets and insulating sheets and guide elements.

Between the two sheets 20,21 there is an insulating layer in the form a non-conducting sheet 19. One of the conductive sheets 20 carries a connection pillar 25 for the positive DC pole, whereas the other conductive sheet 21 carries another connection pillar 26 for the negative DC pole. By specifically shaped connection portions 23a-c and 24a-c (not described in further detail) on the Z-shaped portions 22a,b there is obtained a proper connection of one of the sheets 20 to one of the poles of each capacitor bank 13a-c and a connection of the other sheet 21 to the other pole of each capacitor bank 13a-c. A third conductive layer in the form of three parallel metal sheets 27a-c is separated from the other sheets by an insulating sheet 30 and connected to the power modules 11a-c. These parallel sheets 27a-c are provided with connection pillars 32,33,34 for delivering the 3-phase output AC current to the motor to be driven. See FIG. 6.

For accomplishing a simple, fast and correct mounting of the conductive sheets 20,21 and 27a-c on the power module substrates 12a-c there are provided three guide elements 36a-c of an insulating material, one for each power module. As can be observed in FIG. 4, each one of the guide elements 36a-c is provided with stepped downwardly directed stud portions 37a-c which are intended to be received with friction in apertures of matching sizes in all conductive and insulating sheets. This means that all the conductive and non-conductive sheets can be pre-assembled by means of these guide elements 36a-c to a stack and mounted as a sub-assembly on the substrates 12a-c and the cooling structure 10. See FIG. 5. This means a substantially improved assembling technique.

By having the DC connection to the power modules via the large area conductive sheets 20,21 there is obtained an even and simultaneous DC current supply to all power modules 11a-c, and the DC current is supplied to the power modules 11a-c is symmetric and takes place at a very low impedance, no matter the distance to the connection pillars 25,26. It also means a symmetric current path between each parallel power module 11a-c and corresponding capacitor bank 13a-c.

The drive unit further comprises an electronic control section 40 which comprises a circuit board 41 with electronic components (not illustrated) and which is mounted above the power modules 11a-c by means of connector pin units 42. The control section circuit board 40 is connected to the power modules 11a-c via two elongate circuit board type signal buses 44a,b extending in the multiplying direction A of the drive unit. This type of signal bus has a low resistance and a low impedance for obtaining an even and simultaneous communication between the control section 40 and the power modules 11a-c.

Figure 4:
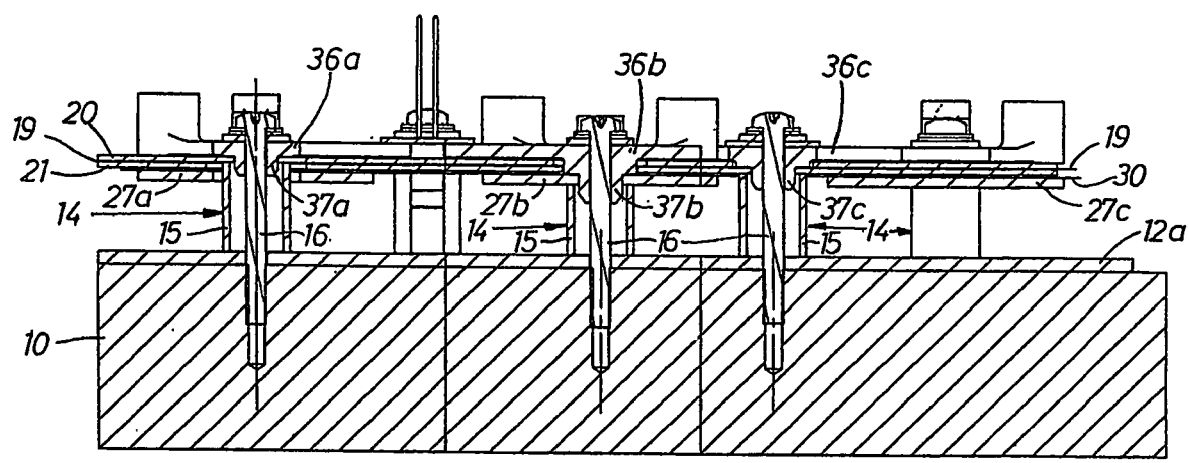
FIG. 4 shows on a larger scale a detail view of the motor drive unit in FIG. 1.
Figure 5:
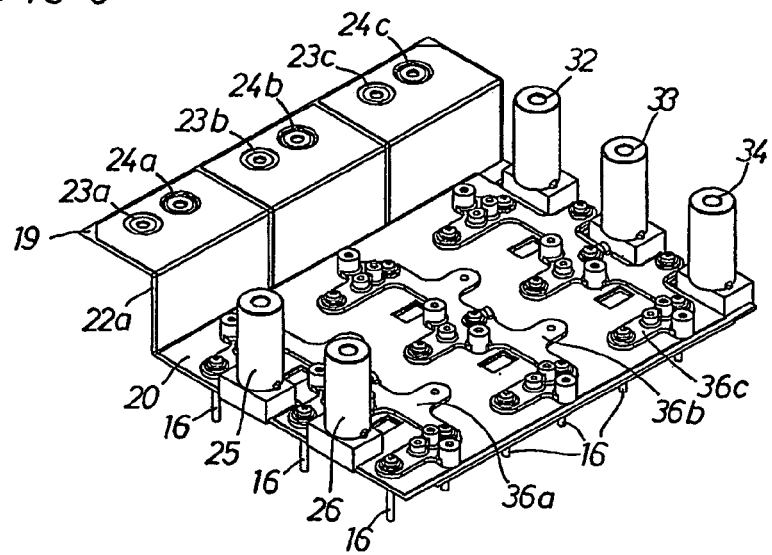
FIG. 5 shows a perspective view of the stacked power module connection sheets.

As illustrated in FIG. 4, the retaining devices 14 have distance pieces 15 of different length for obtaining an electrical as well as thermal contact with the different conducting sheets 20,21,27a-c disposed at different distances from the substrates 12a-c. Apart from retaining the stack of sheets properly in relation to the power module substrates 12a-c the distance pieces 15 are effective in conducting electric current between the sheets 20,21,27a-c and the substrates 12a-c as well as transferring heat developed in the sheets. The retaining devices 14 also clamp the substrates 12a-c into a heat transferring contact with the cooling structure 10.

The modular drive unit design according to the invention means a simplification in adapting the output capacity to motors of different sizes. This means that a suitable number of identical power modules 11a-c are chosen to meet the power demand of the actual motor size. The conductive as well as the non-conductive sheets, however, have to be adapted in size to the actual number of power modules. Also the signal buses 44a,b have to be adapted in length to the actual number of power modules and the total size of the surface area covered by the power modules 11a-c.

In its practical use, the drive unit is provided with a non-illustrated protective hood, wherein the DC terminal pillars 25,26 and the AC output pillars 32,33,34 extend out through the hood for cable connections.

The invention claimed is:

1. Inverter type motor drive unit for feeding AC electric power of variable parameters to an electric motor, comprising:
   an electronic control section (40),
   a power converting and output section controlled by the control section (40),
   two input terminals (25,26) for connection to a DC power source, and
   three output terminals (32,33,34) for delivering a 3-phase AC power to said electric motor,
   wherein the power converting and output section comprises:
   one or more identical power modules (11a-11c), each comprising a complete 3-phase output stage,
   said one or more power modules (11a-11c) are multiplied by a suitable number and interconnected in parallel to meet the power demand of the actual motor size,
   and wherein:
   said one or more power modules (11a-11c) are mounted side by side in a multiplying direction (A) on a cooling structure (10), thereby covering a certain surface area substantially corresponding in size to the surface area covered by the actual number of power modules (11a-11c), and
   said one or more power modules (11a-11c) are connected to said DC input terminals (25, 26) and said AC output terminals (32,33,34) via conductive layers (20,21,27a-27c) which are electrically insulated from each other and extend substantially in parallel with said cooling structure (10) and covering substantially all of said certain surface area.

2. Motor drive unit according to claim 1, wherein one of said conductive layers (27a-27c) is divided into three separate leads (27a-27c) extending in parallel to each other across said power modules (11a-11c) in said multiplying direction (A) and connecting said one or more power modules (11a-11c) in parallel to said AC output terminals (32,33, 34).

3. Motor drive unit according to claim 2, wherein:
   all of said conductive layers (20,21,27a-27c) comprise separate metal sheets, and
   a number of retaining devices (14) are arranged both to connect said metal sheets (20,21,27a-27c) to said one or more power modules (11a-11c) and to clamp said one or more power modules (11a-11c) into a physical heat transferring contact with said cooling structure (10).

4. Motor drive unit according to claim 3, wherein:
   two of said metal sheets (20,21) are connected to said DC input terminals (25,26), and
   said one or more power modules (11a-11c) are connected to capacitor banks (13a-13c) via said two metal sheets (20,21).

5. Motor drive unit according to claim 3, wherein:
   each one of said retaining devices (14) comprises a clamping member (16) and a distance piece (15) for locating each metal sheet (20,21,27a-27c) at a specific distance from said power modules (11a-11c), and
   said distance pieces (15) are electrically conductive and serve to establish an electrical as well as thermal contact between said metal sheets (20,21,27a-27c) and said power modules (11a-11c).

6. Motor drive unit according to claim 5, wherein:
   each one of said distance pieces (15) comprises a metallic tube element, and
   each one of said clamping members (16) comprises a screw extending axially through said tube element (15).

7. Motor drive unit according to claim 1, wherein:
   all of said conductive layers (20,21,27a-27c) comprise separate metal sheets, and
   a number of retaining devices (14) are arranged both to connect said metal sheets (20,21,27a-27c) to said power modules (11a-11c) and to clamp said one or more power modules (11a-11c) into a physical heat transferring contact with said cooling structure (10).

8. Motor drive unit according to claim 7, wherein:
   two of said metal sheets (20,21) are connected to said DC input terminals (245,26), and
   said one or more power modules (11a-11c) are connected to capacitor banks (13a-13c) via said two metal sheets (20,21).

9. Motor drive unit according to claim 7, wherein:
   each one of said retaining devices (14) comprises a clamping member (16) and a distance piece (15) for locating each metal sheet (20,21,27a-27c) at a specific distance from said one or more power modules (11a-11c), and
   said distance pieces (15) are electrically conductive and serve to establish an electrical as well as thermal contact between said metal sheets (20,21,27a-27c) and said power modules (11a-11c).

10. Motor drive unit according to claim 9, wherein:
    each one of said distance pieces (15) comprises a metallic tube element, and
    each one of said clamping members (16) comprises a screw extending axially through said tube element (15).

11. Motor drive unit according to claim 3, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

12. Motor drive unit according to claim 4, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

13. Motor drive unit according to claim 5, wherein the control section (40) comprises a circuit board (41) supported by at least one of said one or more power modules (11a-11c) in a parallel but spaced disposition relative to said metal sheets 5 (20,21,27a-27c) via contact devices (42) extending through apertures in said metal sheets (20,21,27a-27c).

14. Motor drive unit according to claim 6, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

15. Motor drive unit according to claim 7, wherein the control section (40) comprises a circuit board (41) supported by at least one of said power modules (11a-11c) in a parallel but spaced disposition relative to said metal sheets (20,21,27a-27c) via contact devices (42) extending through apertures in said metal sheets (20,21,27a-27c).

16. Motor drive unit according to claim 8, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

17. Motor drive unit according to claim 9, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

18. Motor drive unit according to claim 10, wherein the control section (40) comprises a circuit board (41) supported by at least one of said one or more power modules (11a-11c) in a parallel but spaced disposition relative to said metal sheets (20,21,27a-27c) via contact devices (42) extending through apertures in said metal sheets (20,21,27a-27c).

19. Motor drive unit according to claim 3, wherein:
said conductive metal sheets (20,21,27a-27c) are insulated relative to each other by separate insulating sheets (19, 30) of a non-conductive material sandwiched between said metal sheets (20,21,27a-27c), and
said metal sheets (20,21,27a-27c) and said insulating sheets (19,30) are arranged and fixed in a stack by said clamping members (16) and said distance pieces (15).

20. Motor drive unit according to claim 19, wherein one or more guide elements (36a-36c) of an insulating material are provided with stud portions (37a-37c) which penetrate through openings in said metal sheets (20,21,27a-27c) as well as said insulating sheets (19,30) to, thereby, locate said metal sheets (20,21,27a-27c) and said insulating sheets (19,30) relative to each other prior to said metal sheets (20,21,27a-27c) and said insulating sheets (19,30) being finally fixed by said clamping members (16) and said distance pieces (15) at mounting of said stack on said cooling structure (10).

21. Motor drive unit according to claim 4, wherein:
said conductive metal sheets (20,21,27a-27c) are insulated relative to each other by separate insulating sheets (19, 30) of a non-conductive material sandwiched between said metal sheets (20,21,27a-27c), and
said metal sheets (20,21,27a-27c) and said insulating sheets (19,30) are arranged and fixed in a stack by said clamping members (16) and said distance pieces (15).

22. Motor drive unit according to claim 7, wherein:
said conductive metal sheets (20,21,27a-27c) are insulated relative to each other by separate insulating sheets (19, 30) of a non-conductive material sandwiched between said metal sheets (20,21,27a-27c), and
said metal sheets (20,21,27a-27c) and said insulating sheets (19,30) are arranged and fixed in a stack by said clamping members (16) and said distance pieces (15).

23. Motor drive unit according to claim 8, wherein one or more guide elements (36a-36c) of an insulating material are provided with stud portions (37a-37c) which penetrate through openings in said metal sheets (20,21,27a-27c) as well as said insulating sheets (19,30) to, thereby, locate said metal sheets (20,21,27a-27c) and said insulating sheets (19,30) relative to each other prior to said metal sheets (20,21,27a-27c) and said insulating sheets (19,30) being finally fixed by said clamping members (16) and said distance pieces (15) at mounting of said stack on said cooling structure (10).

24. Motor drive unit according to claim 22, wherein one or more guide elements (36a-36c) of an insulating material are provided with stud portions (37a-37c) which penetrate through openings in said metal sheets (20,21,27a-27c) as well as said insulating sheets (19,30) to, thereby, locate said metal sheets (20,21,27a-27c) and said insulating sheets (19, 30) relative to each other prior to said metal sheets (20,21,27a-27c) and said insulating sheets (19,30) being finally fixed by said clamping members (16) and said distance pieces (15) at mounting of said stack on said cooling structure (10).

25. Motor drive unit according to claim 1, wherein:
said conductive layers (20,21,27a-27c) comprise separate metal sheets (20,21,27a-27c), and
said DC input terminals (25,26) and said AC output terminals (32,33,34) are located at opposite ends of said metal sheets (20,21,27a-27c) in relation to said multiplying direction (A).

26. Motor drive unit according to claim 2, wherein:
said conductive layers (20,21,27a-27c) comprise separate metal sheets (20,21,27a-27c), and
said DC input terminals (25,26) and said AC output terminals (32,33,34) are located at opposite ends of said metal sheets (20,21,27a-27c) in relation to said multiplying direction (A).

27. Motor drive unit according to claim 1, wherein a signal bus means 44a,44b) extends across said one or more power modules 11a-11c) in said multiplying direction (A) and is arranged to connect said control section (40) to each one of said one or more power modules 11a-11c)and communicating signals between said control section (40) and said one or more power modules 11a-11c).

28. Motor drive unit according to claim 27, wherein said signal bus means 44a,44b) comprises at least one circuit board 44a,44b).

29. Motor drive unit according to claim 2, wherein a signal bus means 44a,44b) extends across said one or more power modules 11a-11c) in said multiplying direction (A) and is arranged to connect said control section (40) to each one of said one or more power modules 11a-11c) and communicating signals between said control section (40) and said one or more power modules 11a-11c).

30. Motor drive unit according to claim 27, wherein said signal bus means 44a,44b) comprises at least one circuit board 44a,44b).

* * * * *